（12）United States Patent
Yamazaki

(10) Patent No.: US 11,761,988 B2
(45) Date of Patent: Sep. 19, 2023

(54) SENSOR

(71) Applicant: KABUSHIKI KAISHA TOSHIBA, Tokyo (JP)

(72) Inventor: Hiroaki Yamazaki, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/665,301

(22) Filed: Feb. 4, 2022

(65) Prior Publication Data
US 2023/0084037 A1  Mar. 16, 2023

(30) Foreign Application Priority Data

Sep. 15, 2021 (JP) .................................. 2021-149926

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC .......................... G01R 15/181; G01R 19/0092

USPC ......................................................... 324/127
See application file for complete search history.

(56) References Cited

U.S. PATENT DOCUMENTS

| 2019/0187184 A1* | 6/2019 | Urankar | ............ G01R 19/0092 |
| 2020/0209284 A1* | 7/2020 | Torres | .................... G01R 19/12 |
| 2020/0373379 A1* | 11/2020 | Sashida | ................. H01F 41/041 |
| 2020/0386793 A1* | 12/2020 | Rondot | ................ G01R 15/181 |

FOREIGN PATENT DOCUMENTS

JP        2020-180895 A     11/2020

* cited by examiner

*Primary Examiner* — Tung X Nguyen
*Assistant Examiner* — Robert P Alejnikov, Jr.
(74) *Attorney, Agent, or Firm* — Finnegan, Henderson, Farabow, Garrett & Dunner, LLP

(57) ABSTRACT

According to one embodiment, a sensor includes a base, and a first structure body. The base includes semiconductor dement including the first dement electrode. The first structure body includes a first conductive member and a coil. The first conductive member is electrically connected with the first element electrode. The coil is provided around the first conductive member in a first plane crossing a first direction from the base to the first structure body.

19 Claims, 10 Drawing Sheets

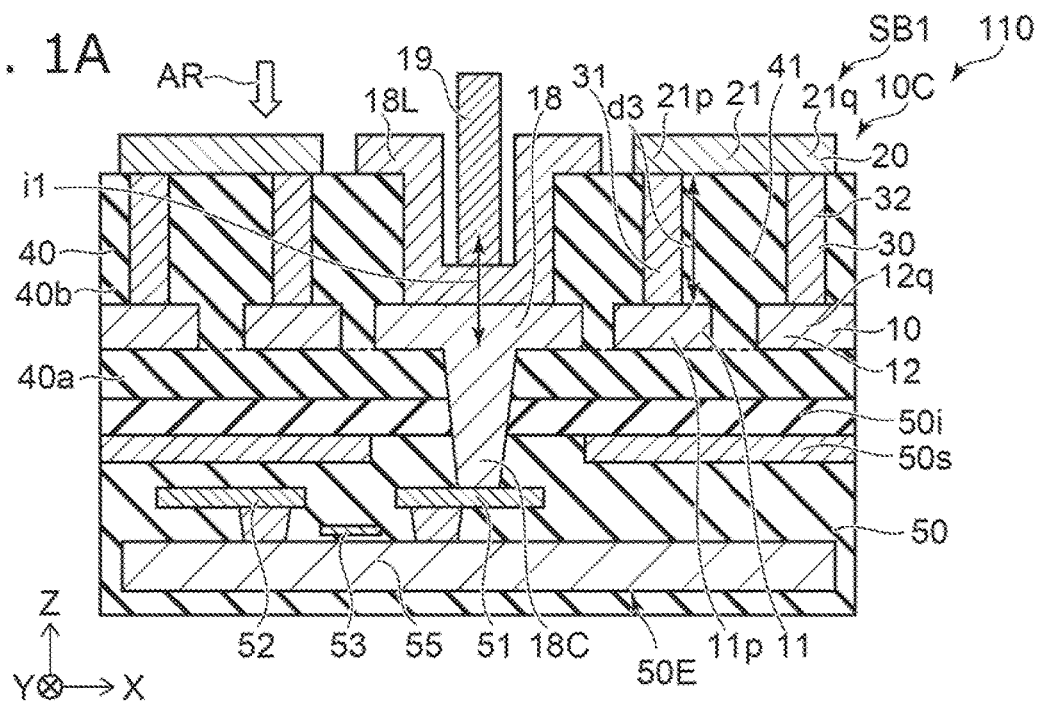
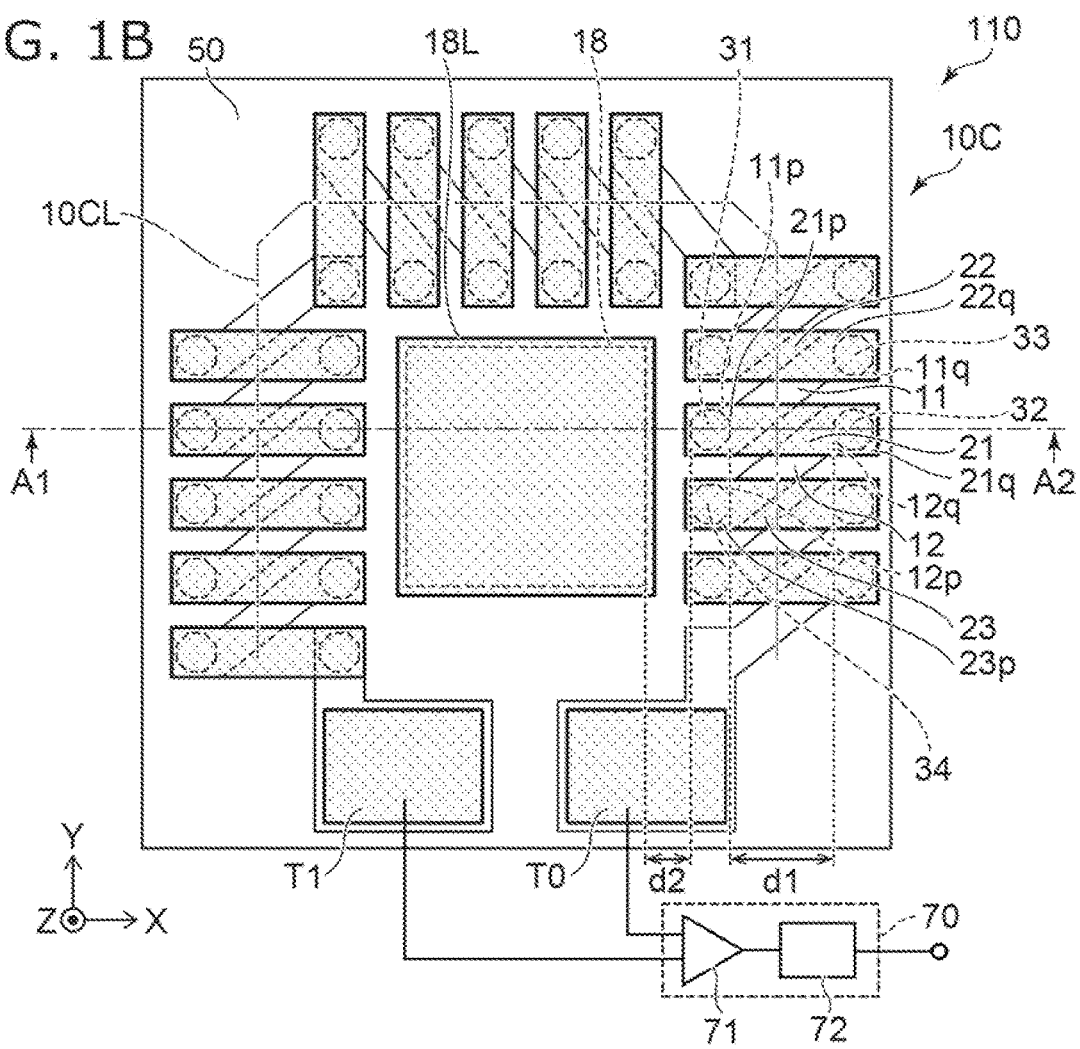

SENSOR

CROSS-REFERENCE TO RELATED APPLICATIONS

This application is based upon and claims the benefit of priority from Japanese Patent Application No. 2021-149926, filed on Sep. 15, 2021; the entire contents of which are incorporated herein by reference.

FIELD

Embodiments described herein relate generally to a sensor.

BACKGROUND

For example, there is a sensor that detects current using a coil or the like. Improvement of the characteristics of the sensor is desired.

BRIEF DESCRIPTION OF THE DRAWINGS

FIG. 1A and FIG. 1B are schematic views illustrating a sensor according to the first embodiment;

DETAILED DESCRIPTION

Figure 2:
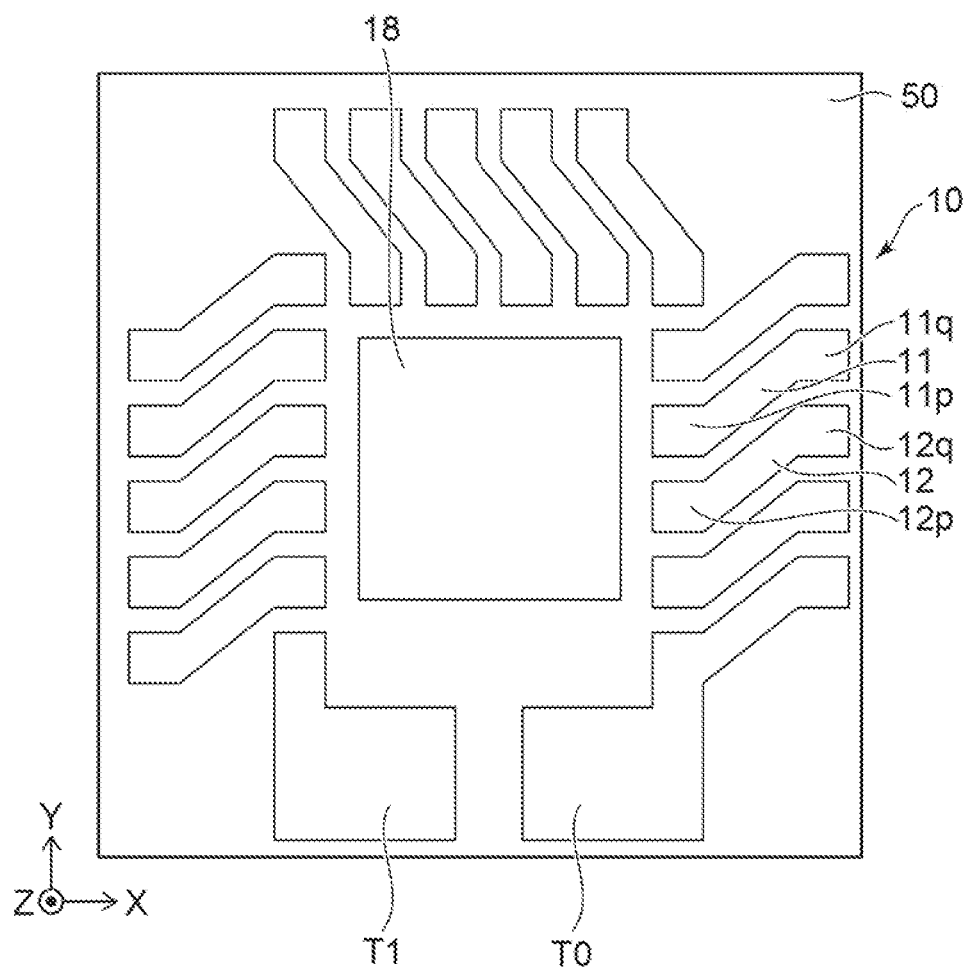
FIG. 2 is a schematic plan view illustrating the sensor according to the first embodiment.

According to one embodiment, a sensor includes a base, and a first structure body. The base includes semiconductor element including the first element electrode. The first structure body includes a first conductive member and a coil. The first conductive member is electrically connected with the first element electrode. The coil is provided around the first conductive member in a first plane crossing a first direction from the base to the first structure body.

According to one embodiment, a sensor includes a base, and a first structure body. The first structure body includes a first conductive member and a coil. The coil is provided around the first conductive member in a first plane crossing a first direction from the base to the first structure body. An electric signal obtained from the coil is configured to change according to a current flowing through the first conductive member. The current includes a component along the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A and FIG. 1B are schematic views illustrating a sensor according to the first embodiment.

FIG. 1A is a cross-sectional view taken along the line A1-A2 of FIG. 1B. FIG. 1B is a transparent plan view seen from the arrow AR of FIG. 1A.

As shown in FIGS. 1A and 1B, a sensor 110 according to the embodiment includes a base 50 and a first structure body SB1. The first structure body SB1 includes a first conductive member 18 and a coil 10C.

A first direction from the base 50 to the first structure body SB1 is a Z-axis direction. One direction perpendicular to the Z-axis direction is defined as an X-axis direction. The direction perpendicular to the Z-axis direction and the X-axis direction is defined as a Y-axis direction.

In this example, the base 50 includes a semiconductor element 50E. The semiconductor element 50E includes a first element electrode 51. The semiconductor element 50E includes, for example, a semiconductor layer 55, a first element electrode 51, and a second element electrode 52. In this example, the semiconductor element 50E includes a third element electrode 53.

In one example, the semiconductor element 50E is a transistor. In the embodiment, the semiconductor element 50E may be a two-terminal element. The semiconductor element 50E is, for example, a semiconductor element for power control. The semiconductor element 50E may include, for example, a diode or a power transistor. The power transistor may include, for example, a power MOSET or an insulated gate bipolar transistor (IGBT). The semiconductor element 50E may include, for example, a thyristor, a gate turn-off thyristor (GTO), a triac, or the like.

The first element electrode 51 is, for example, a source electrode. The first element electrode 51 may be one of an anode and a cathode.

For example, the first conductive member 18 of the first structure body SB1 is provided on the base 50. For example, a direction from the base 50 to the first conductive member 18 is along the first direction (Z-axis direction). For example, a direction from the base 50 to the coil 10C is along the first direction. The first conductive member 18 is electrically insulated from the coil 10C. The first conductive member 18 is insulated from the coil 10C in a direct current.

The first conductive member 18 is electrically connected with, for example, the first element electrode 51. In this example, the first conductive member 18 is electrically connected with the first element electrode 51 by the connecting member 18C. A position of the connecting member 18C may be provided at a position different from the cross section illustrated in FIG. 1A.

The coil 10C is provided around the first conductive member 18 in a first plane. The first plane crosses the first direction (Z-axis direction). The first plane is, for example, the X-Y plane. For example, the coil 10C is around the first conductive member 18 when viewed along the arrow AR shown in FIG. 1A. A direction from the first conductive member 18 to the coil 10C crosses the first direction (Z-axis direction).

An electric signal obtained from the coil 10C changes according to the current i1 flowing through the first conductive member 18. For example, the first conductive member 18 and the connecting member 19 are electrically connected. In this example, the pad electrode 18L is provided on the first conductive member 18, and the end portion of the connecting member 19 is provided on the pad electrode 18L. The connecting member 19 is electrically connected with the first element electrode 51 via the first conductive member 18. The current i1 flowing through the first element electrode 51 flows through the first conductive member 18 and the connecting member 19. The current i1 flowing through the first conductive member 18 includes a component along the first direction. The current i1 is, for example, an alternating current.

For example, a magnetic field caused by the current i1 is generated around the current i1 (for example, around the connecting member 19). When the current i1 changes, the magnetic field changes. A part of the magnetic field passes through the coil 10C. A change in the electrical signal based on a change in the magnetic field occurs in the coil 10C. In the embodiment, the change in the current flowing through the first conductive member 18 can be detected by detecting the electric signal generated in the coil 10C. Thereby, for example, an abnormality of the current flowing through the first element electrode 51 can be detected.

In the embodiment, the first structure body SB1 including the coil 10C is stacked on the semiconductor element 50E including the first element electrode 51. For example, the size of the first structure body SB1 including the coil 10C is likely to be about the same as the size of the semiconductor element 50E. A small and highly sensitive sensor can be provided.

For example, a reference example in which the coil 10C is provided around the semiconductor element 50E can be considered. In the reference example, as the coil 10C, for example, a via electrode provided in the semiconductor substrate is used. In this reference example, the size of the coil 10C in the XV plane is larger than the size of the semiconductor element 50E. In the reference example, the size of the sensor including the coil 10C is larger than that of the semiconductor element 50E. Further, when trying to make the sensor smaller, the width of one turn of the coil 10C becomes smaller. Therefore, it is difficult for the magnetic field based on the current i1 to efficiently pass through the coil 10C. In the reference example using the via electrode, it is difficult to improve the characteristics of the coil 10C due to parasitic component (capacitance, resistance) on the semiconductor substrate.

On the other hand, in the embodiment, the coil 10C is stacked on the semiconductor element 50E including the first element electrode 51. Therefore, it is easy to miniaturize the first structure body SB1 including the coil 10C. Further, even if the size of the first structure body SB1 is small, it is easy to increase the size of one turn of the coil 10C. Since the size of one turn of the coil 10C is large, the magnetic field based on the current i1 efficiently passes through the coil 10C. As a result, high sensitivity can be easily obtained.

According to the embodiment, it is possible to provide a sensor whose characteristics can be improved.

As shown in FIG. 1B, the sensor 110 may include a terminal T0 and a terminal T1. The terminal T0 is electrically connected with a part (for example, one end) of the coil 10C. The terminal T1 is electrically connected with another part (for example, another end) of the coil 10C. By detecting the electric signal generated between the terminal T0 and the terminal T1, the change in the current i1 can be detected.

The sensor 110 may include the processor 70 (see FIG. 1B). The processor 70 is electrically connected with the coil 10C via the terminal T0 and the terminal T1. The processor 70 receives an electric signal generated in the coil 10C. The processor 70 includes, for example, an amplifier circuit 71 and an integrating circuit 72. An electric signal generated in the coil 10C is input to the amplifier circuit 71. The amplifier circuit 71 amplifies the electric signal generated in the coil 10C. The integrating circuit 72 integrates the output of the amplifier circuit 71. For example, the output of the integrating circuit 72 is used as the output of the processing unit 70.

In the embodiment, at least a part of the center line 10CL of the coil 10C (see FIG. 1B) is around the first conductive member 18 in the first plane (X-Y plane).

The coil 10C includes a Rogowski coil. For example, a part of the coil 10C may be a Rogowski coil.

In this example, the coil 10C includes a plurality of electrode layers 10, a plurality of conductive layers 20, and a plurality of connecting members 30. A positions of the plurality of electrode layers 10 in the first direction (Z-axis direction) are different from a positions of the plurality of conductive layers 20 in the first direction. In this example, the position of the plurality of electrode layers 10 in the first direction (Z-axis direction) is between the position of the base 50 in the first direction and the position of the plurality of conductive layers 20 in the first direction. The position of the plurality of connecting members 30 in the first direction is between the position of the plurality of electrode layers 10 in the first direction and the position of the plurality of conductive layers 20 in the first direction. One of the plurality of connecting members 30 electrically connects one of the plurality of electrode layers 10 with one of the plurality of conductive layers 20.

Figure 3:
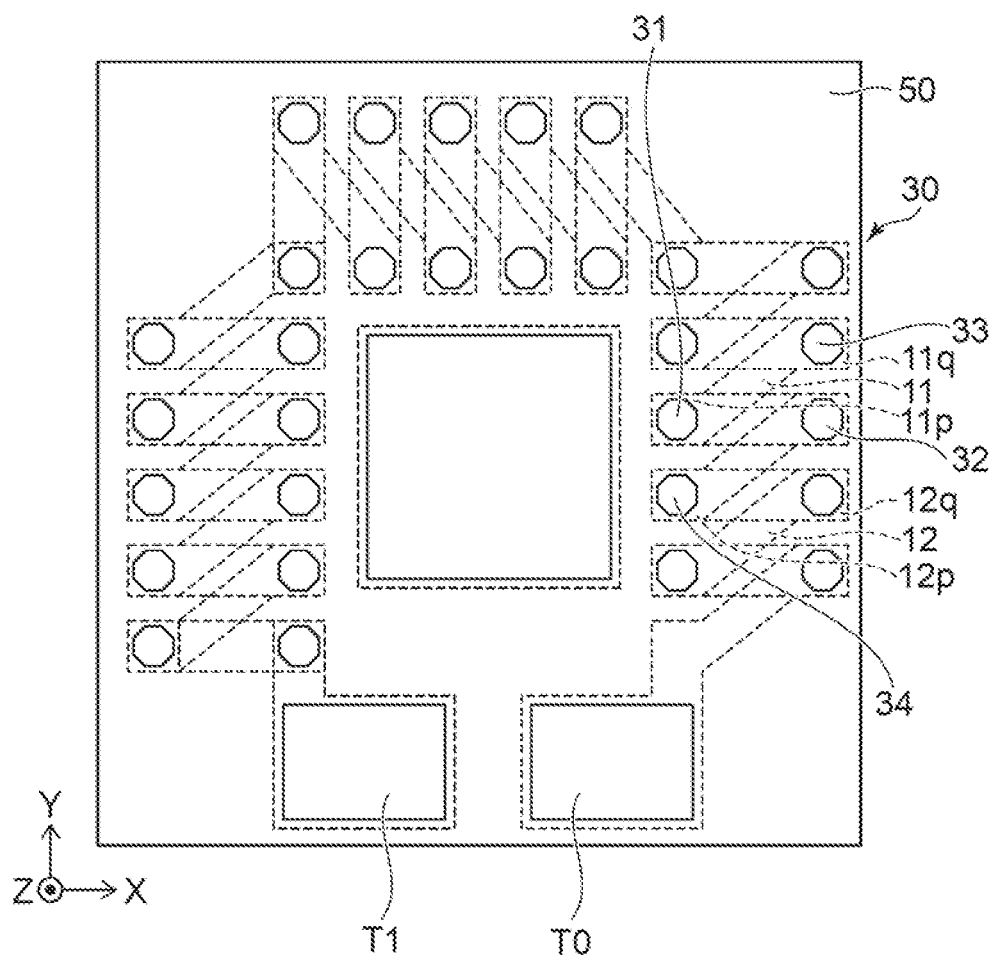
FIG. 3 is a schematic plan view illustrating the sensor according to the first embodiment.
Figure 4:
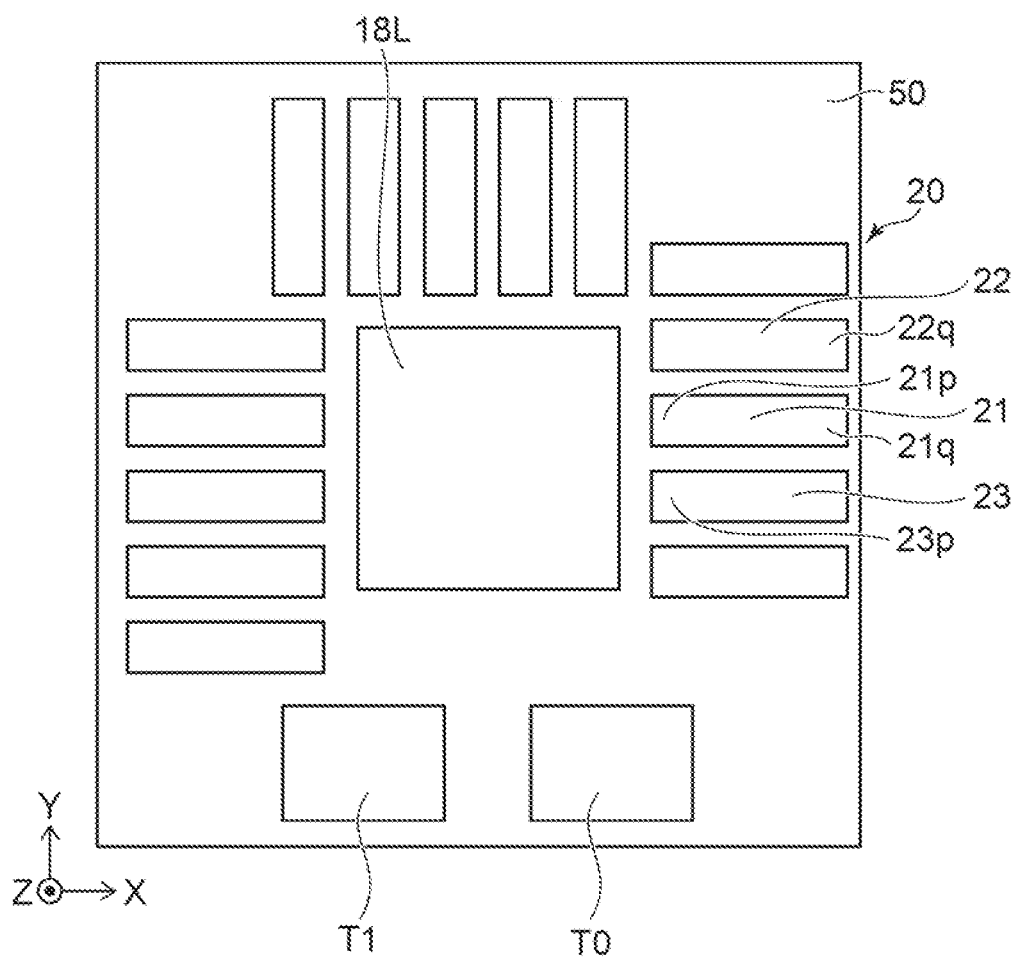
FIG. 4 is a schematic plan view illustrating the sensor according to the first embodiment.

FIG. 2 to FIG. 4 are schematic plan views illustrating the sensor according to the first embodiment.

FIG. 2 illustrates a pattern of a plurality of electrode layers 10. FIG. 3 illustrates a pattern of a plurality of connecting members 30. In FIG. 3, a plurality of electrode layers 10 are illustrated by wavy lines. FIG. 4 illustrates a pattern of a plurality of conductive layers 20.

As shown in FIGS. 2 and 4, the direction in which the plurality of electrode layers 10 extend in the X-Y plane may be inclined with respect to the direction in which the plurality of conductive layers 20 extend in the XY plane.

As shown in FIG. 2, the plurality of electrode layers 10 include a first electrode layer 11, a second electrode layer 12, and the like. As shown in FIG. 3, the plurality of connecting members 30 include, for example, a first connecting member 31, a second connecting member 32, a third connecting member 33, a fourth connecting member 34, and the like. As shown in FIG. 4, the plurality of conductive layers 20 include a first conductive layer 21, a second conductive layer 22, a third conductive layer 23, and the like.

As shown in FIGS. 1B to 4, the first connecting member 31 included in the plurality of connecting members 30 electrically connects a part 11p of the first electrode layer 11 included in the plurality of electrode layers 10 with a part 21p of the first conductive layer 21 included in the layer 20.

As shown in FIGS. 1B to 4, the second connecting member 32 included in the plurality of connecting members 30 electrically connects a part 12q of the second electrode layer 12 included in the plurality of electrode layers 10 with another part 21q of the layer 21.

As shown in FIGS. 1B to 4, the third connecting member 33 included in the plurality of connecting members 30 electrically connects another part 11q of the first electrode layer 11 with a part 22q of the conductive layer 22 included in the plurality of conductive layers 20.

As shown in FIGS. 1B to 4, the fourth connecting member 34 included in the plurality of connecting members 30 electrically connects another part 12p of the second electrode layer 12 with a part 23p of the conductive layer 23 included in the plurality of conductive layers 20.

In this way, the plurality of electrode layers 10 and the plurality of conductive layers 20 are electrically connected by the plurality of connecting members 30. As a result, the coil 10C is formed.

As shown in FIG. 3, for example, the distance between the first connecting member 31 and the first conductive member 18 is shorter than the distance between the second connecting member 32 and the first conductive member 18. The distance between the fourth connecting member 34 and the first conductive member 18 is shorter than the distance between the third connecting member 33 and the first conductive member 18. For example, the first connecting member 31 and the fourth connecting member 34 correspond to the inner side portion of the coil 10C. The second connecting member 32 and the third connecting member 33 correspond to the outer side portion of the coil 10C is formed. The plurality of electrode layers 10 correspond to the lower portion (the portion on the side of the base 50) of the coil 10C. The plurality of conductive layers 20 correspond to the upper portion of the coil 10C.

As shown in FIG. 1A, in this example, the positions of the plurality of electrode layers 10 in the Z-axis direction are the same as the positions of the first conductive member 18 in the Z-axis direction. For example, the direction from the first conductive member 18 to the plurality of electrode layers 10 is along the first plane (for example, the XY plane). For example, the direction from the first conductive member 18 to the first electrode layer 11 is along the first plane. The direction from the first conductive member 18 to the second electrode layer 12 is along the first plane. In the embodiment, the direction from the first conductive member 18 to the plurality of conductive layers 20 may be along the first plane (for example, the XY plane).

As shown in FIG. 1B, a distance between the first connecting member 31 and the second connecting member 32 is defined as the first distance d1. The first distance d1 may be, for example, the shortest distance. A distance between the first conductive member 18 and the first connecting member 31 is defined as the second distance d2. The second distance d2 may be, for example, the shortest distance. In embodiments, the first distance d1 is preferably longer than the second distance d2. The first distance d1 corresponds to the width of one turn of the coil 10C. By the first distance d1 being long, the magnetic field passing through the coil 10C increases. Higher sensitivity is obtained.

In the embodiment, the first distance d1 is, for example, not less than 10 μm and not more than 10000 μm. The second distance d2 is, for example, not less than 1 μm and not more than 1000 μm. The third distance d3 is, for example, not less than 1 μm and not more than 1000 μm.

In the embodiment, the inside of the coil 10C may be a void. An insulating member or the like may be provided in the coil 10C.

As shown in FIG. 1A, the sensor 110 further includes an insulating member 40. At least a part 41 of the insulating member 40 is between at least one of the plurality of electrode layers 10 and at least one of the plurality of conductive layers 20. For example, by providing the insulating member 40 in the coil 10C, the shapes of the plurality of electrode layers 10 and the plurality of conductive layers 20 are stabilized. A stable coil 10C can be obtained.

At least a part 41 of the insulating member 40 includes, for example, at least one selected from the group consisting of resin, silicon oxide and silicon nitride. The resin includes, for example, polyimide, and the like.

As shown in FIG. 1A, the insulating member 40 may include a first insulating layer 40a, a second insulating layer 40b, and the like. The first insulating layer 40a is provided between the base 50 and the first conductive member 18. At least a part of the second insulating layer 40b is provided between the plurality of electrode layers 10 and the plurality of conductive layers 20. The first insulating layer 40a includes, for example, at least one selected from the group consisting of silicon oxide and silicon nitride. The second insulating layer 40b includes a resin or silicon oxide.

As shown in FIG. 1A, the sensor 110 may include a metal layer 50s. The metal layer 50s is provided between the base 50 and the first structure body SB1. The metal layer 50s functions as, for example, an electromagnetic field shield against electromagnetic field noise generated from the base 50. The metal layer 50s includes, for example, at least one selected from the group consisting of Al and Fe.

As shown in FIG. 1A, the sensor 110 may include an insulating film 50i. The insulating film 50i is provided between the metal layer 50s and the first structure body SB1. The insulating film 50i includes, for example, at least one selected from the group consisting of resin, silicon oxide and silicon nitride.

In the embodiment, at least one of the plurality of electrode layers 10, the plurality of conductive layers 20, and the plurality of connecting members 30 may include at least one selected from the group consisting of Al, Cu, Ni, Ti and Au.

In the embodiment, the insulating member 40 may include a magnetic material. For example, at least a part of the insulating member 40 may include ferrite. At least a part of the insulating member 40 may include iron oxide.

Figure 5:
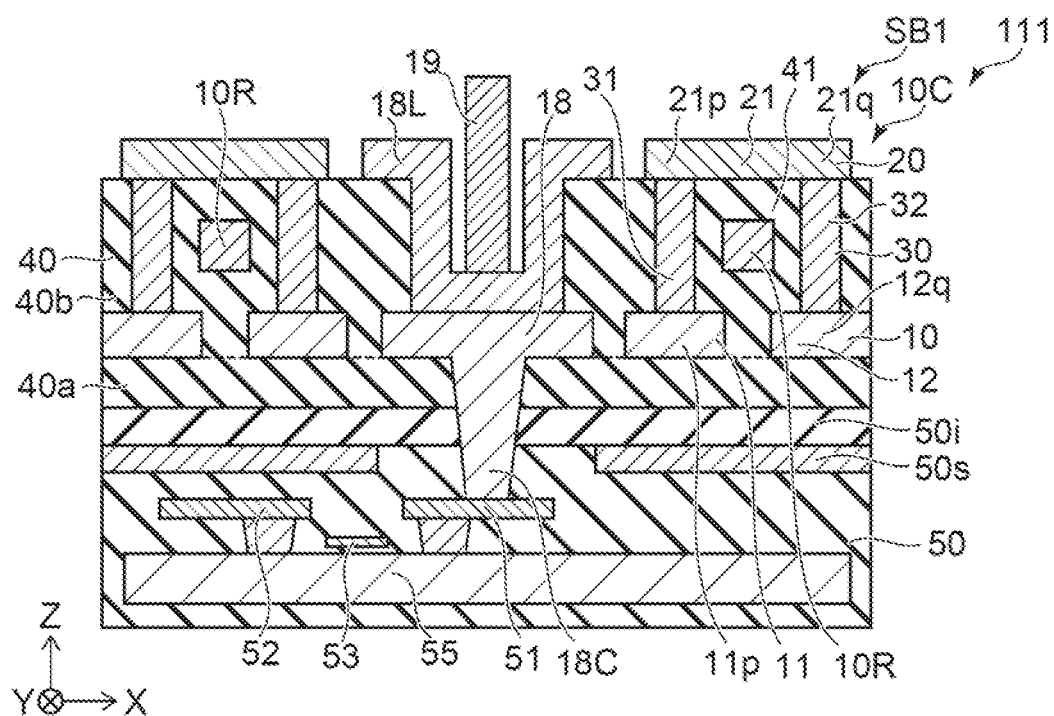
FIG. 5 is a schematic cross-sectional view illustrating a sensor according to the first embodiment.

FIG. 5 is a schematic cross-sectional view illustrating a sensor according to the first embodiment.

As shown in FIG. 5, in a sensor 111 according to the embodiment, the coil 10C of the first structure body SB1 includes a return line portion 10R. Other configurations of the sensor 111 may be the same as those of the sensor 110.

As shown in FIG. 5, the return line portion 10R passes between the plurality of electrode layers 10, the plurality of conductive layers 20, and the plurality of connecting members 30. The return line portion 10R is conductive. At least a part 41 of the insulating member 40 is located between the plurality of electrode layers 10 and the return line portion 10R, and between the plurality of conductive layers 20 and the return line portion 10R.

Figure 6:
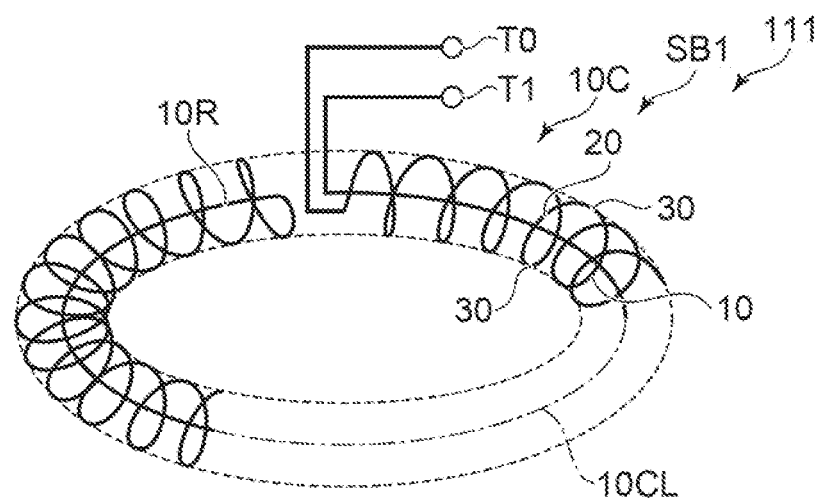
FIG. 6 is a schematic diagram illustrating the sensor according to the first embodiment.

FIG. 6 is a schematic diagram illustrating a sensor according to the first embodiment.

FIG. 6 illustrates the coil 10C in a sensor 111. As shown in FIG. 6, the winding portion of the coil 10C is formed by the plurality of electrode layers 10, the plurality of conductive layers 20, and the plurality of connecting members 30. The return line portion 10R passes through the winding portion of the coil 10C. By providing the return line portion 10R, the influence of an external magnetic field is suppressed. It becomes easier to obtain higher accuracy. In the embodiment, the return line portion 10R may include a magnetic material.

Figure 7:
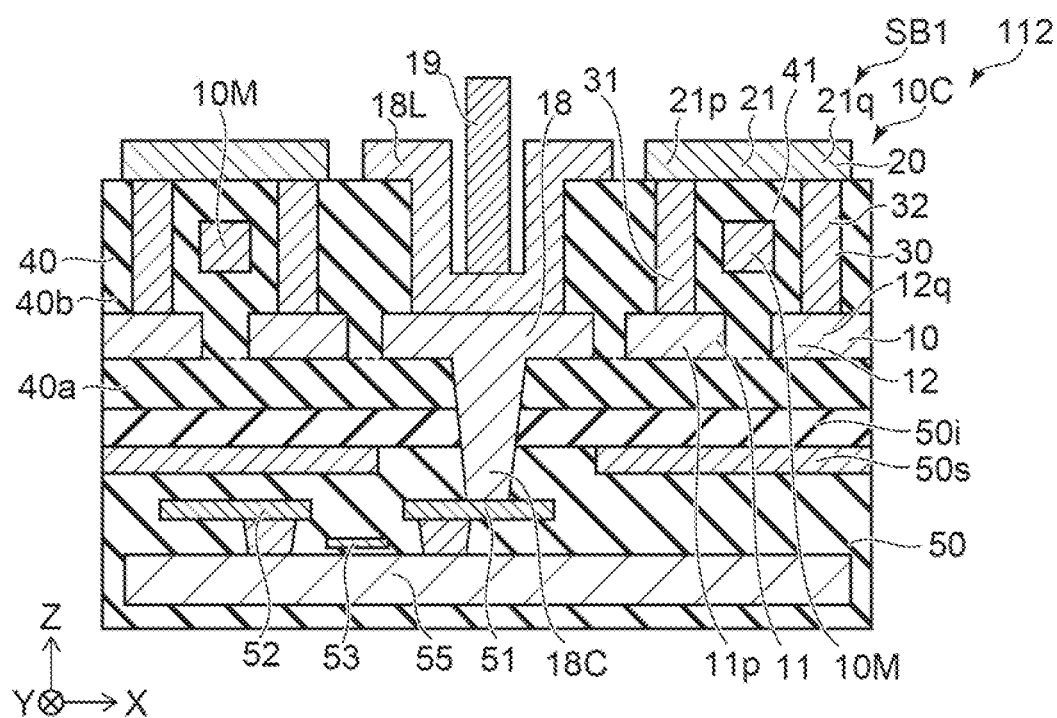
FIG. 7 is a schematic cross-sectional view illustrating a sensor according to the first embodiment.

FIG. 7 is a schematic cross-sectional view illustrating a sensor according to the first embodiment.

As shown in FIG. 7, in a sensor 112 according to the embodiment, the coil 10C of the first structure body SB1 includes a magnetic member 10M. Other configurations of the sensor 112 may be the same as those of the sensor 110.

As shown in FIG. 7, at least a part of the magnetic member 10M is between the plurality of electrode layers 10 and the plurality of conductive layers 20. The magnetic member 10M is, for example, between the inner side portion of the coil 10C and the outer side portion of the coil 10C. The inner side includes, for example, a first connecting member 31 and a fourth connecting member 34. The outer side includes, for example, a second connecting member 32 and a third connecting member 33. The magnetic member 10M may function as, for example, the magnetic core of the coil 10C. The magnetic member 10M may include, for example, ferrite. By providing the magnetic member 10M, the magnetic field due to the current i1 is applied to the coil 10C more efficiently. Higher sensitivity is obtained.

On the other hand, since the magnetic member 10M is not provided, for example, the influence of saturation of magnetic characteristics does not occur. By not providing the magnetic member 10M, for example, the influence of hysteresis caused by the magnetic member 10M is suppressed.

Figure 8:
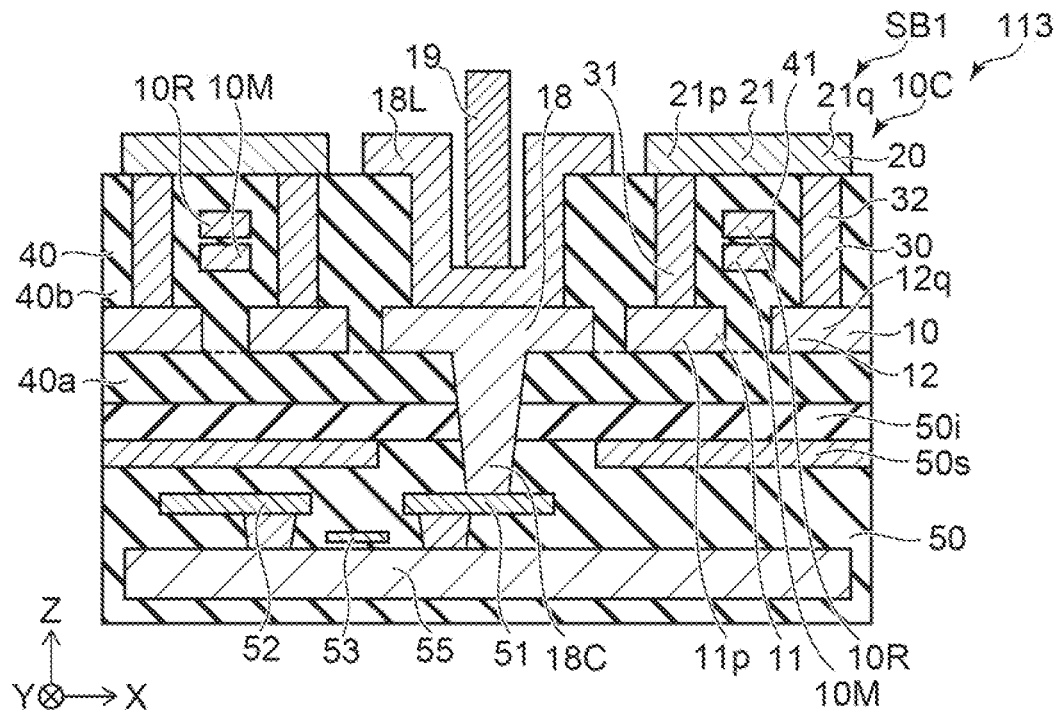
FIG. 8 is a schematic cross-sectional view illustrating a sensor according to the first embodiment.

FIG. 8 is a schematic cross-sectional view illustrating a sensor according to the first embodiment.

As shown in FIG. 8, the return line portion 10R and the magnetic member 10M may be provided in the coil 10C of the first structure body SB1 as in a sensor 113 according to the embodiment. Other configurations of the sensor 113 may be the same as those of the sensor 110.

Figure 9:
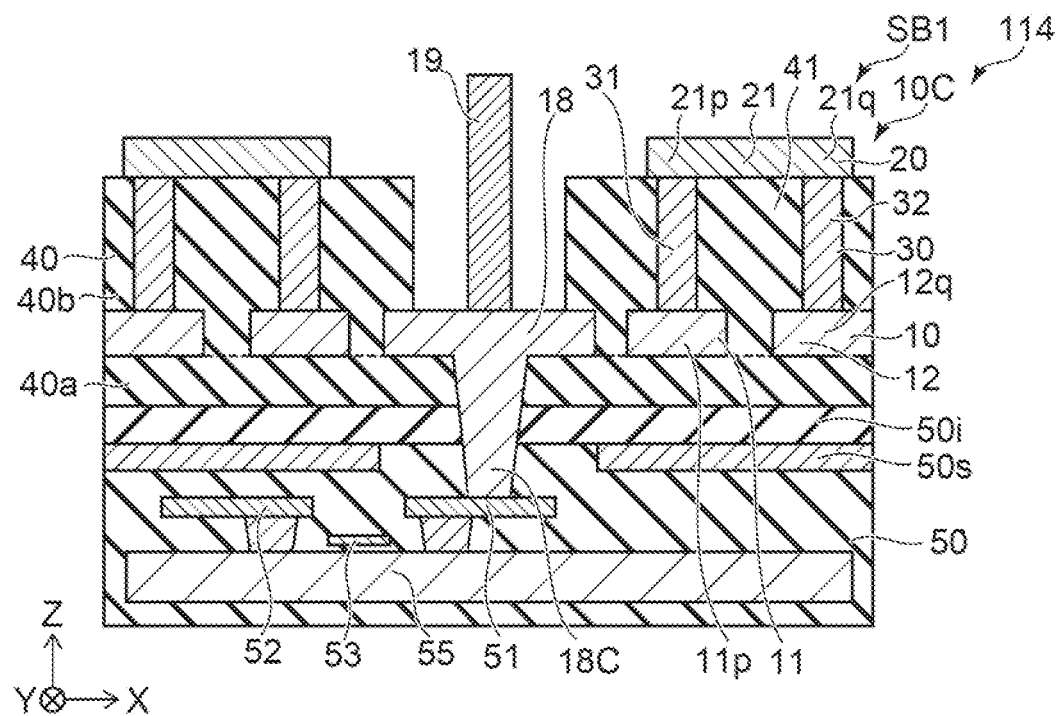
FIG. 9 is a schematic cross-sectional view illustrating a sensor according to the first embodiment.

FIG. 9 is a schematic cross-sectional view illustrating a sensor according to the first embodiment.

As shown in FIG. 9, the pad electrode 18L may be omitted as in a sensor 114 according to the embodiment. The connecting member 19 is electrically connected with the first element electrode 51. The first element electrode 51 may function as a pad electrode. Other configurations of the sensor 114 may be the same as those of the sensor 110.

Figure 10:
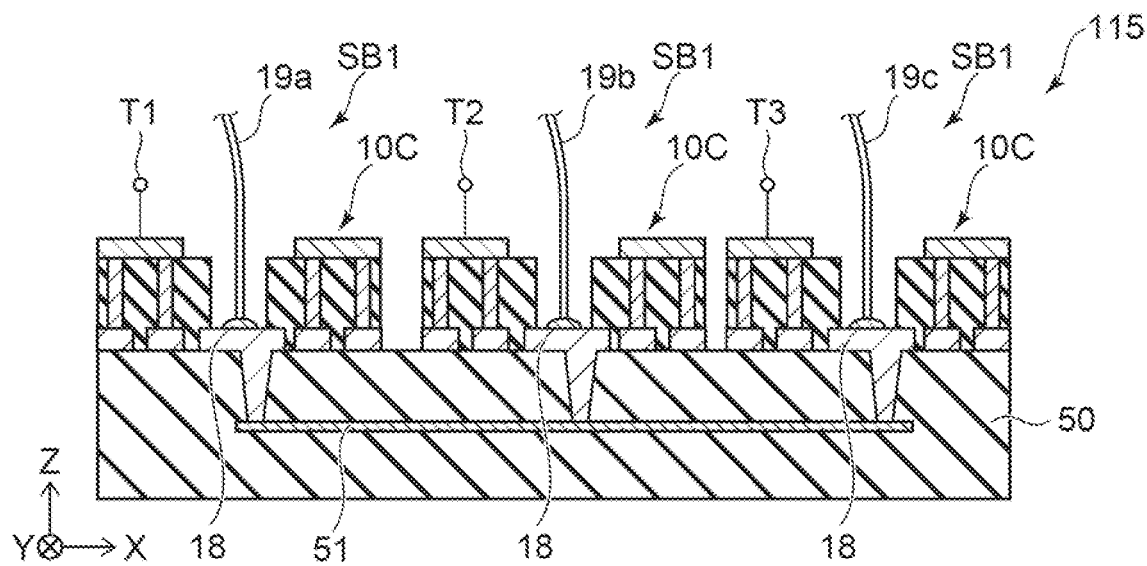
FIG. 10 is a schematic cross-sectional view illustrating a sensor according to the first embodiment.

FIG. 10 is a schematic cross-sectional view illustrating a sensor according to the first embodiment.

As shown in FIG. 10, a sensor 115 according to the embodiment includes a base 50 and a plurality of first structure bodies SB1. A direction from the base 50 to the plurality of first structure bodies SB1 is along the first direction (Z-axis direction). Each of the plurality of first structure bodies SB1 includes the first conductive member 18 and the coil 10C. Each of the first conductive members 18 of the plurality of first structure bodies SB1 is electrically connected with the first element electrode 51 included in the base 50. In each of the plurality of first structure bodies SB1, connecting members (connecting members 19a to 19c, etc.) are electrically connected with the first conductive member 18.

The change in the current i1 flowing through each of the first conductive members 18 of the plurality of first structure bodies SB1 can be detected by the respective coils 10C of the plurality of first structure bodies SB1. For example, by detecting the electric signals generated at the terminals T1 to T3, the change in the current flowing through the connecting members 19a to 19c can be detected. The terminals T1 to T3 include two terminals of each of the plurality of coils 10C.

For example, in the semiconductor element 50E included in the base 50, a plurality of connecting members (connecting members 19a to 19c, etc.) may be provided. As a result, a large current can be controlled. The first structure bodies SB1 may be provided corresponding to two or more of the plurality of connecting members. As a result, a change (for example, an abnormality) in the current i1 flowing through the plurality of connecting members can be detected.

Figure 11:
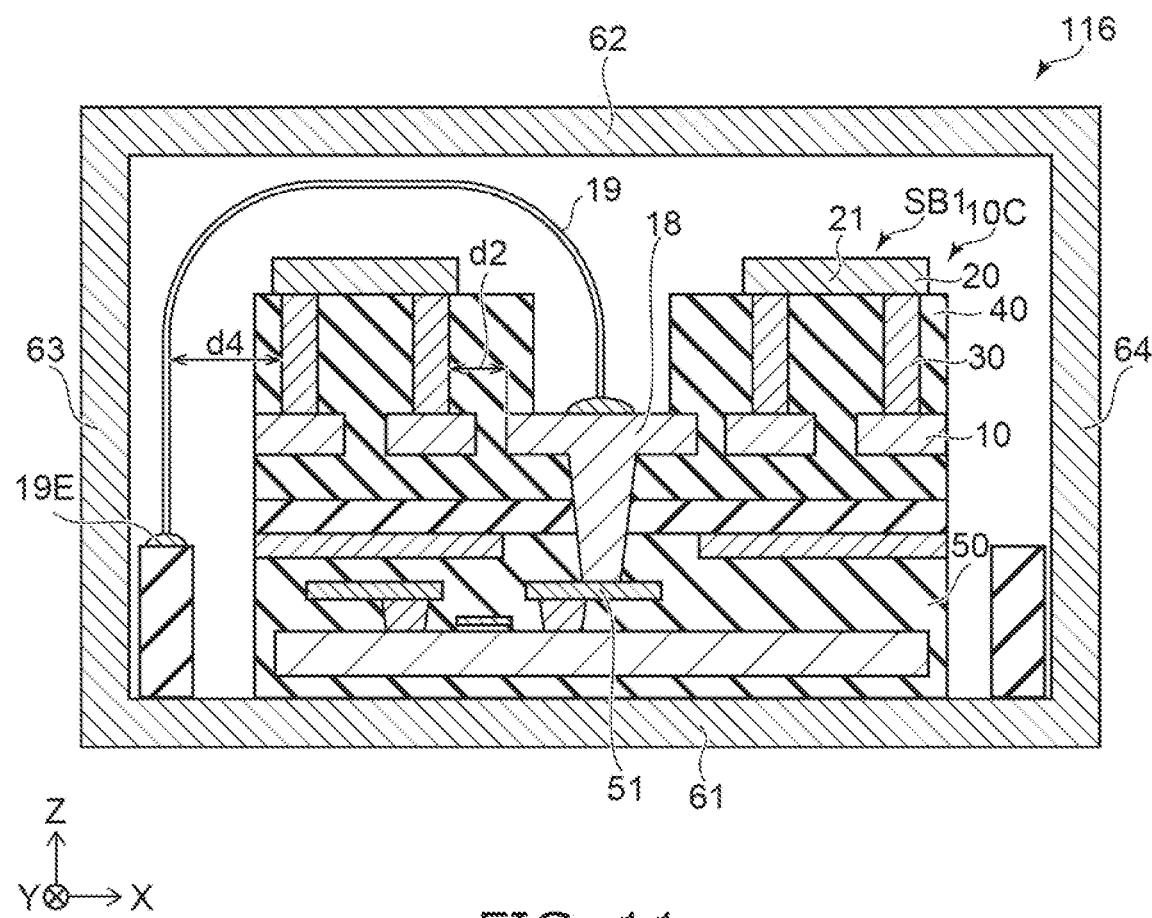
FIG. 11 is a schematic cross-sectional view illustrating a sensor according to the first embodiment.

FIG. 11 is a schematic cross-sectional view illustrating a sensor according to the first embodiment.

As shown in FIG. 11, a sensor 116 according to the embodiment includes the first member 61 and the second member 62 in addition to the base 50 and the first structure body SB1. The base 50 and a first structure body SB1 are provided between the first member 61 and the second member 62. At least one of the first member 61 or the second member 62 functions as a magnetic shield. At least one of the first member 61 or the second member 62 attenuates an external magnetic field. By providing a magnetic shield, more stable and highly accurate detection becomes possible.

In this example, the direction from the first member 61 to the second member 62 is along the first direction (Z-axis direction).

As shown in FIG. 11, the sensor 116 according to the embodiment may include a third member 63 and a fourth member 64. The base 50 and the first structure body SB1 are provided between the third member 63 and the fourth member 64. At least one of the third member 63 or the fourth member 64 functions as a magnetic shield. At least one of the third member 63 or the fourth member 64 attenuates an external magnetic field. By providing a magnetic shield, more stable and highly accurate detection becomes possible.

As shown in FIG. 11, in this example, a terminal portion 19E is provided on the first member 61. One end of the connecting member 19 is electrically connected with the first conductive member 18. The other end of the connecting member 19 is electrically connected with the terminal portion 19E. A distance between the other end of the connecting member 19 and the first conductive member 18 is defined as a fourth distance d4. The fourth distance d4 is preferably longer than the second distance d2. As shown in FIG. 1B, the second distance corresponds to the distance between the first conductive member 18 and the coil 10C (for example, the first connecting member 31). For example, the influence of the magnetic field generated at the other end of the connecting member 19 can be suppressed.

Figure 12:
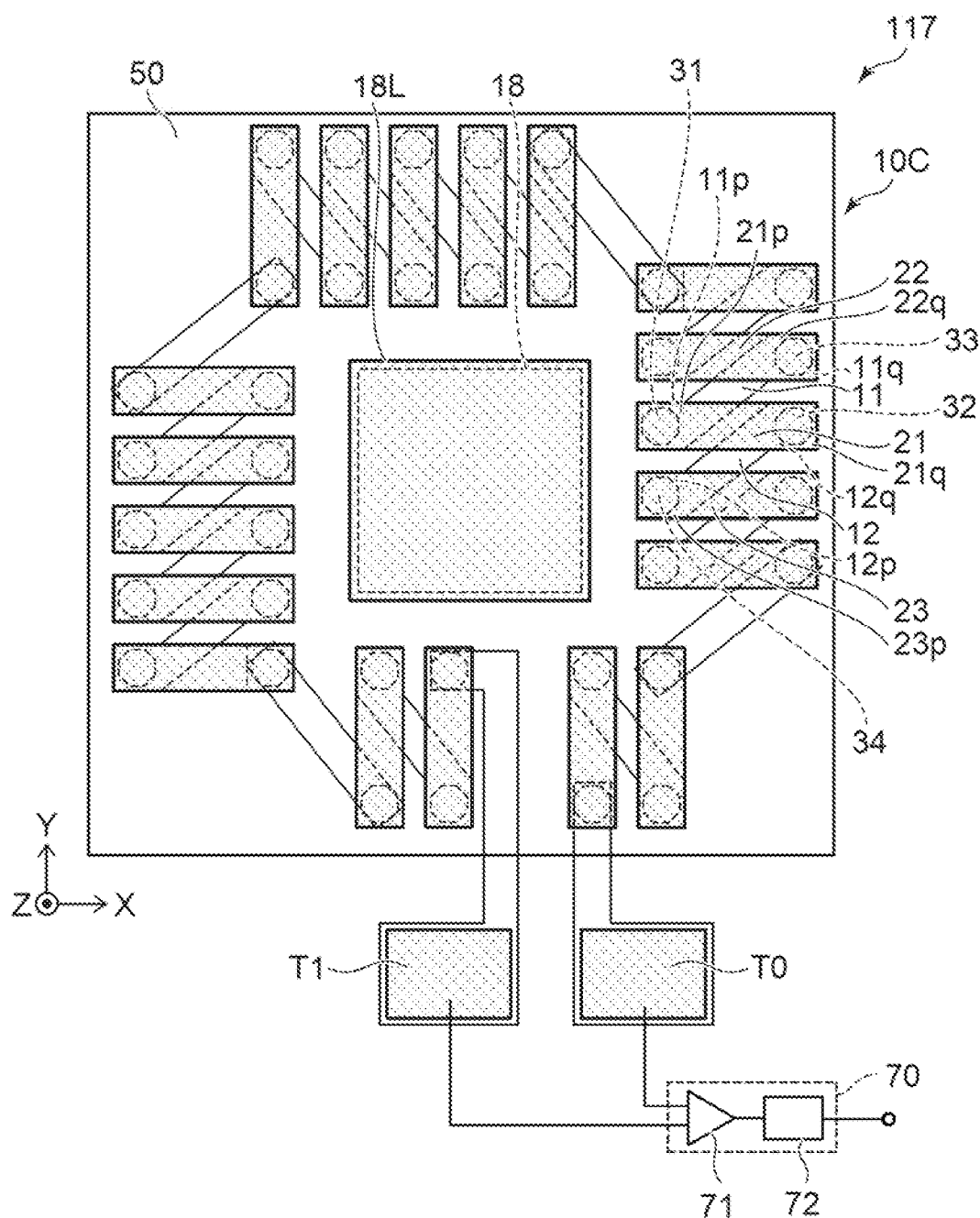
FIG. 12 is a schematic plan view illustrating a sensor according to the first embodiment.

FIG. 12 is a schematic plan view illustrating a sensor according to the first embodiment.

As shown in FIG. 12, in a sensor 117 according to the embodiment, the coil 10C may be provided around the first conductive member 18 in the X-Y plane.

Second Embodiment

Figure 13:
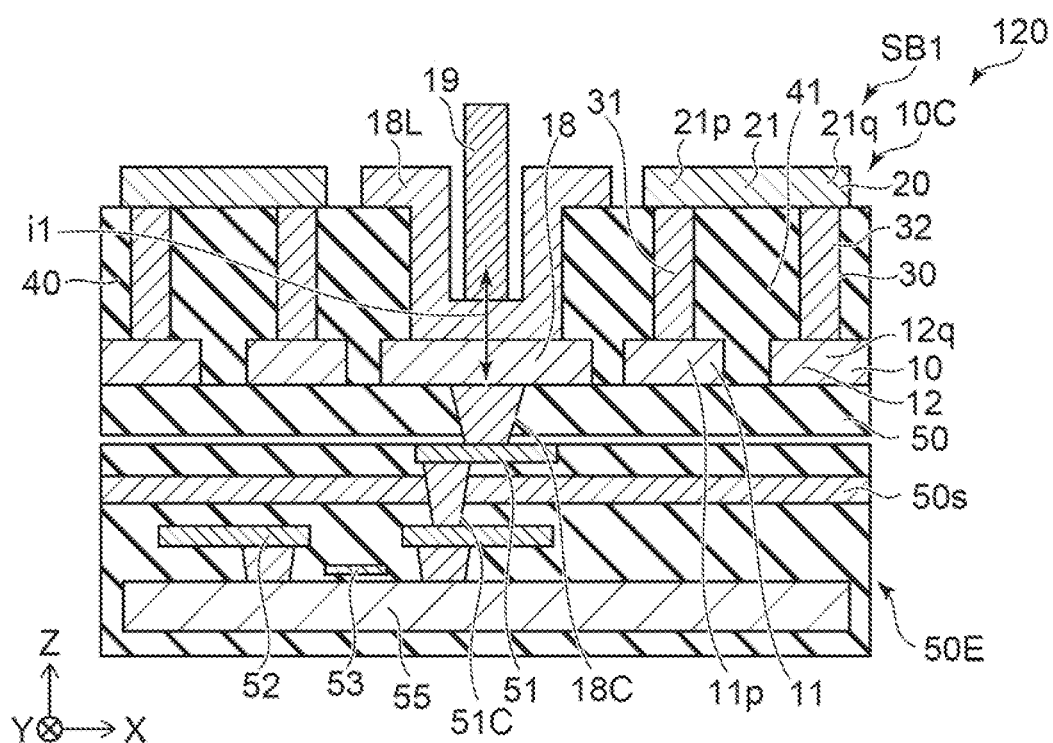
FIG. 13 is a schematic cross-sectional view illustrating a sensor according to the second embodiment.

FIG. 13 is a schematic cross-sectional view illustrating a sensor according to a second embodiment.

As shown in FIG. 13, a sensor 120 according to the embodiment includes the base 50 and the first structure body SB1. In the sensor 120, the semiconductor element 50E is provided separately from the base 50. The sensor 120 is stacked with the semiconductor element 50E. Other configurations of the sensor 120 may be the same as the configuration of the sensor 110.

Also in the sensor 120, the first structure body SB1 includes the first conductive member 18 and the coil 10C.

The coil 10C is provided around the first conductive member 18 in a first plane (for example, the X-Y plane) that crosses the first direction (Z-axis direction) from the base 50 to the first structure body SB1. The electric signal obtained from the coil 10C changes according to the current i1 which flows through the first conductive member 18 and includes a component along the first direction.

The base 50 of the sensor 120 may be fixed to the semiconductor element 50E. The first conductive member 18 can be electrically connected with the first element electrode 51 included in the semiconductor element 50E by a connecting member 18C or the like. The first element electrode 51 may be a source electrode or the like. The first element electrode 51 may be connected with the semiconductor layer 55 by a connecting member 51C or the like.

In the sensor 120, the size of the first structure body SB1 can be reduced to about the size of the base 50. The size of the first structure body SB1 can be reduced to about the size of the semiconductor element 50E. The width and height of the coil 10C can be increased. Highly sensitive and highly accurate detection is possible. It is possible to provide a sensor whose characteristics can be improved.

The embodiments may include following configurations (for example, technical proposals).

Configuration 1

A sensor, comprising:
a base including semiconductor element including the first element electrode; and
a first structure body, the first structure body including
a first conductive member electrically connected with the first element electrode
a coil provided around the first conductive member in a first plane crossing a first direction from the base to the first structure body.

Configuration 2

The sensor according to Configuration 1, wherein an electric signal obtained from the coil changes according to a current flowing through the first conductive member, and the current includes a component along the first direction.

Configuration 3

A sensor, comprising:
a base; and
a first structure body,
the first structure body including
a first conductive member,
a coil provided around the first conductive member in a first plane crossing a first direction from the base to the first structure body,
an electric signal obtained from the coil being configured to change according to a current flowing through the first conductive member, the current including a component along the first direction.

Configuration 4

The sensor according to one of Configurations 1-3, wherein at least a part of a centerline of the coil is around the first conductive member in the first plane.

Configuration 5

The sensor according to one of Configurations 1-4, wherein the coil includes a Rogowski coil.

Configuration 6

The sensor according to one of Configurations 1-5, wherein the coil includes;
a plurality of electrode layers,
a plurality of conductive layers, and
a plurality of connecting members,
a first connecting member included in the connecting members electrically connects a part of a first electrode layer included in the electrode layers with a part of a first conductive layer included in the conductive layers,
a second connecting member included in the connecting members electrically connects a part of a second electrode layer included in the electrode layers with an other part of the first conductive layer.

Configuration 7

The sensor according to Configuration 6, wherein
a third connecting member included in the connecting members electrically connects an other part of the first electrode layer with a part of a second conductive layer included in the conductive layers, and
a fourth connecting member included in the connecting members electrically connects an other part of the second electrode layer with a part of a third conductive layer included in the conductive layers.

Configuration 8

The sensor according to Configuration 7, wherein
a distance between the first connecting member and the first conductive member is shorter than a distance between the second connecting member and the first conductive member, and
a distance between the fourth connecting member and the first conductive member is shorter than a distance between the third connecting member and the first conductive member.

Configuration 9

The sensor according to Configuration 7 or 8, wherein
a direction from the first conductive member to the first electrode layer is along the first plane, and
a direction from the first conductive member to the second electrode layer is along the first plane.

Configuration 10

The sensor according to one of Configurations 6-9, wherein
a first distance between the first connecting member and the second connecting member is longer than a second distance between the first conductive member and the first connecting member.

Configuration 11

The sensor according to Configuration 10, wherein a distance between the part of the first electrode layer and the part of the first conductive layer along the first direction is not less than ½ of the second distance.

Configuration 12

The sensor according to one of Configurations 6-11, wherein
the coil further includes a return line portion, and
the return line portion passes between the electrode layers, the conductive layers, and the connecting members.

Configuration 13

The sensor according to Configuration 12, further comprising an insulating member,
at least a part of the insulating member being between the electrode layers and the return line portion, and between the conductive layers and the return line portion.

Configuration 14

The sensor according to one of Configurations 6-12, further comprising an insulating member,
at least a part of the insulating member being between at least one of the electrode layers and at least one of the conductive layers.

Configuration 15

The sensor according to Configuration 14, wherein the at least the part including at least one selected from the group consisting of resin, silicon oxide and silicon nitride.

Configuration 16

The sensor according to Configuration 14, wherein the insulating member includes a magnetic material.

Configuration 17

The sensor according to one of Configurations 6-16, further comprising a magnetic member, and
at least a part of the magnetic member being between the electrode layers and the conductive layers.

Configuration 18

The sensor according to one of Configurations 6-17, wherein at least one of the electrode layers, the conductive layers, or the connecting members includes at least one selected from the group consisting of Al, Cu, Ni, Ti and Au.

Configuration 19

The sensor according to one of Configurations 1-18, further comprising a processor electrically connected with the coil,
the processor being configured to receive an electric signal generated in the coil, and
the processor including an amplifier circuit configured to amplify the electric signal, and an integrating circuit configured to integrate an output of the amplifier circuit.

Configuration 20

The sensor according to one of Configurations 1-19, wherein the first conductive member is insulated from the coil.

According to the embodiments, it is possible to provide a sensor whose characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
    a base including semiconductor element including the first element electrode; and
    a first structure body, the first structure body including:
        a first conductive member electrically connected with the first element electrode, and
        a coil provided around the first conductive member in a first plane crossing a first direction from the base to the first structure body,
    wherein the coil comprises:
        a plurality of electrode layers,
        a plurality of conductive layers, and
        a plurality of connecting members, and
    wherein:
        a first connecting member included in the connecting members electrically connects a part of a first electrode layer included in the electrode layers with a part of a first conductive layer included in the conductive layers, and
        a second connecting member included in the connecting members electrically connects a part of a second electrode layer included in the electrode layers with an other part of the first conductive layer.

2. The sensor according to claim 1, wherein an electric signal obtained from the coil changes according to a current flowing through the first conductive member, and the current includes a component along the first direction.

3. The sensor according to claim 1, wherein at least a part of a centerline of the coil is around the first conductive member in the first plane.

4. The sensor according to claim 1, wherein the coil includes a Rogowski coil.

5. The sensor according to claim 1, wherein
a third connecting member included in the connecting members electrically connects an other part of the first electrode layer with a part of a second conductive layer included in the conductive layers, and
a fourth connecting member included in the connecting members electrically connects an other part of the second electrode layer with a part of a third conductive layer included in the conductive layers.

6. The sensor according to claim 5, wherein
a distance between the first connecting member and the first conductive member is shorter than a distance between the second connecting member and the first conductive member, and
a distance between the fourth connecting member and the first conductive member is shorter than a distance between the third connecting member and the first conductive member.

7. The sensor according to claim 5, wherein
a direction from the first conductive member to the first electrode layer is along the first plane, and
a direction from the first conductive member to the second electrode layer is along the first plane.

8. The sensor according to claim 1, wherein a first distance between the first connecting member and the second connecting member is longer than a second distance between the first conductive member and the first connecting member.

9. The sensor according to claim 8, wherein a distance between the part of the first electrode layer and the part of the first conductive layer along the first direction is not less than ½ of the second distance.

10. The sensor according to claim 1, wherein
the coil further includes a return line portion, and
the return line portion passes between the electrode layers, the conductive layers, and the connecting members.

11. The sensor according to claim 10, further comprising an insulating member,
at least a part of the insulating member being between the electrode layers and the return line portion, and between the conductive layers and the return line portion.

12. The sensor according to claim 1, further comprising an insulating member,
at least a part of the insulating member being between at least one of the electrode layers and at least one of the conductive layers.

13. The sensor according to claim 12, wherein the at least the part including at least one selected from the group consisting of resin, silicon oxide and silicon nitride.

14. The sensor according to claim 12, wherein the insulating member includes a magnetic material.

15. The sensor according to claim 1, further comprising a magnetic member, and
at least a part of the magnetic member being between the electrode layers and the conductive layers.

16. The sensor according to claim 1, wherein at least one of the electrode layers, the conductive layers, or the connecting members includes at least one selected from the group consisting of Al, Cu, Ni, Ti and Au.

17. The sensor according to claim 1, further comprising a processor electrically connected with the coil,
the processor being configured to receive an electric signal generated in the coil, and
the processor including an amplifier circuit configured to amplify the electric signal, and an integrating circuit configured to integrate an output of the amplifier circuit.

18. The sensor according to claim 1, wherein the first conductive member is insulated from the coil.

19. A sensor, comprising:
a base; and
a first structure body,
the first structure body including:
a first conductive member, and
a coil provided around the first conductive member in a first plane crossing a first direction from the base to the first structure body, an electric signal obtained from the coil being configured to change according to a current flowing through the first conductive member, the current including a component along the first direction,
wherein the coil comprises:
a plurality of electrode layers,
a plurality of conductive layers, and
a plurality of connecting members, and
wherein:
a first connecting member included in the connecting members electrically connects a part of a first electrode layer included in the electrode layers with a part of a first conductive layer included in the conductive layers, and
a second connecting member included in the connecting members electrically connects a part of a second electrode layer included in the electrode layers with an other part of the first conductive layer.

* * * * *

UNITED STATES PATENT AND TRADEMARK OFFICE
CERTIFICATE OF CORRECTION

| | |
|---|---|
| PATENT NO. | : 11,761,988 B2 |
| APPLICATION NO. | : 17/665301 |
| DATED | : September 19, 2023 |
| INVENTOR(S) | : Hiroaki Yamazaki |

It is certified that error appears in the above-identified patent and that said Letters Patent is hereby corrected as shown below:

On the Title Page

Item (57) (Abstract), Lines 2-3, "semiconductor dement including the first dement" should read --semiconductor element including the first element--.

Signed and Sealed this
Twenty-third Day of April, 2024

Katherine Kelly Vidal
*Director of the United States Patent and Trademark Office*